(12) United States Patent
Delevoye et al.

(10) Patent No.: US 7,675,217 B2
(45) Date of Patent: Mar. 9, 2010

(54) MECHANICAL OSCILLATOR FORMED BY A NETWORK OF BASIC OSCILLATORS

(75) Inventors: Elisabeth Delevoye, Grenoble (FR); Jean-Charles Barbe, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/939,934

(22) Filed: Nov. 14, 2007

(65) Prior Publication Data

US 2008/0150392 A1 Jun. 26, 2008

(30) Foreign Application Priority Data

Dec. 22, 2006 (FR) ................................ 06 55909

(51) Int. Cl.
*G01C 19/00* (2006.01)
*G01P 9/00* (2006.01)

(52) U.S. Cl. .................................... 310/309; 73/504.13

(58) Field of Classification Search ................. 310/309; 73/504.12, 504.13
See application file for complete search history.

(56) References Cited

U.S. PATENT DOCUMENTS

| 5,869,760 | A | 2/1999 | Geen |
| 7,012,479 | B2* | 3/2006 | Akiba et al. ................ 333/110 |
| 7,205,867 | B2* | 4/2007 | Lutz et al. ................... 333/186 |
| 7,227,432 | B2* | 6/2007 | Lutz et al. ................... 333/186 |
| 7,240,552 | B2* | 7/2007 | Acar et al. ................ 73/504.12 |
| 7,323,952 | B2* | 1/2008 | Pan et al. .................... 333/186 |
| 2002/0105393 | A1 | 8/2002 | Clark et al. |
| 2005/0206479 | A1 | 9/2005 | Nguyen et al. |
| 2007/0018096 | A1* | 1/2007 | Kawakatsu ................. 250/309 |

FOREIGN PATENT DOCUMENTS

FR 2 876 180 A1 4/2006
WO WO 2006/083482 A2 8/2006

* cited by examiner

*Primary Examiner*—Thomas M Dougherty
(74) *Attorney, Agent, or Firm*—Oblon, Spivak, McClelland, Maier & Neustadt, L.L.P.

(57) ABSTRACT

A mechanical oscillator including: at least two deformable linking beams connected to a stationary substrate at a plurality of anchoring points which are distributed along the deformable linking beams, the deformable linking beams facing each other; and a plurality of vibrating cells each connected to and disposed between the at least two deformable linking beams, the plurality of vibrating cells being distributed along the deformable linking beams and a length between two of the plurality of anchoring points being greater or equal to a length of a number of cells greater or equal to 1, wherein each of the plurality of vibrating cells includes a deformable beam having a closed contour, the deformable beam being connected to the at least two deformable linking beams at a first pair of parts which are opposite to each other in the deformable beam.

27 Claims, 5 Drawing Sheets

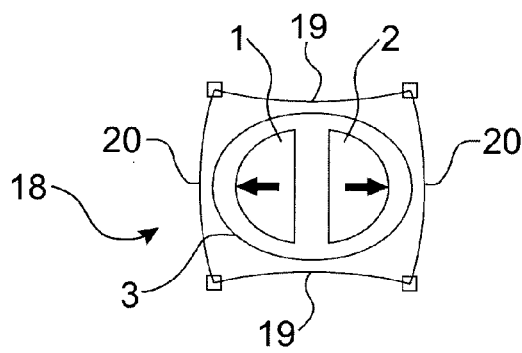
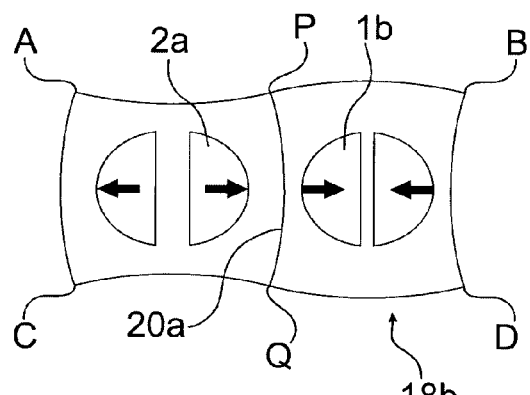
FIG. 6   FIG. 7
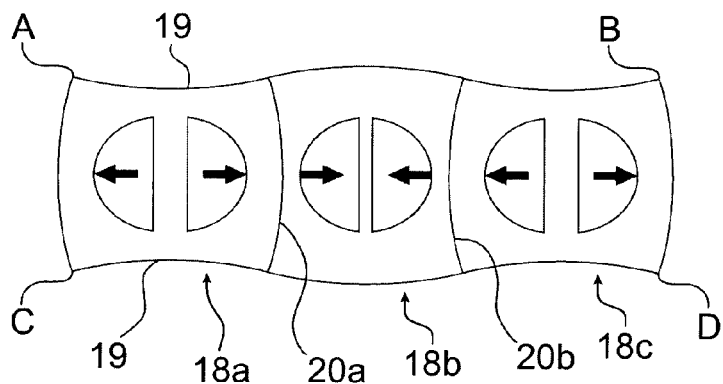
FIG. 8
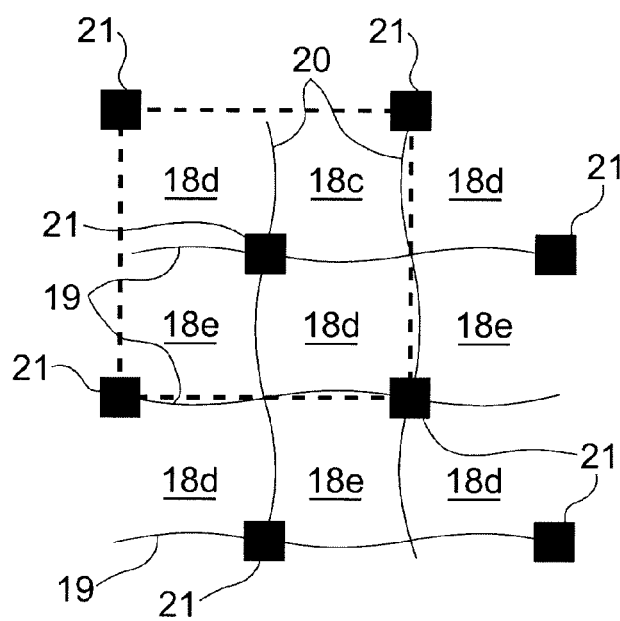
FIG. 9

MECHANICAL OSCILLATOR FORMED BY A NETWORK OF BASIC OSCILLATORS

BACKGROUND OF THE INVENTION

This invention relates to a mechanical oscillator formed by a network of basic oscillators.

This network of basic mechanical oscillators has couplings suitable for propagating a signal or a disturbance from an initial position to other places in the network. The fields in which the spatial or temporal changes of signals and their phase is exploited are non-linear or chaotic systems, data coding or decoding, disturbance propagation analysis systems, neural networks, systems for interpreting boundary conditions by generation of representative stationary states, networks enabling the amplification and analysis of instationary disturbance variables, and networks sensitive to a physical disturbance variable such as a variation in pressure, acceleration or the like. The oscillator network can be constructed by deposition and etching techniques used in micromechanics.

A plurality of mechanical oscillator networks paired together have been proposed in the prior art documents, although there appear to have been few concrete productions. In the document "Surface micromachine segmented mirrors for adaptive optics" (Cowan W. D.; Lee M. K.; Welsh, B. M. Bright, V. M.; Roggemann, M. C.; IEEE Journal of Selected Topics in Quantum Electronics, Vol 5, Issue 1, January-February 1999 Page(s): 90-101), a coupling between parallel vibrating beams is produced by a connecting wire or beam. A strong or weak coupling is obtained between the vibrating beams according to the relative rigidity of this connecting device; however, it remains unchanged even though it would be desirable to be capable of regulating it in many applications, and it is not known how to extend such a coupling to a large network, especially two-dimensional, of beams. In a slightly different design, shown in U.S. Pat. No. 6,917,138 B2, a coupling between oscillators is produced by a deformable and elastic beam that can be modelled as a spring, of which the characteristics can be adjusted in order to define the resonance modes of the assembly. The disadvantage of the spring coupling is that the exchange of energy between the basic oscillators is excessive and the oscillators therefore cannot generally be stabilised. Other designs of the prior art have one or the other of these disadvantages, according to their constitution.

The basic oscillators comprising the network can be constructed according to the French patent no. 2 876 180 of the applicant; it is in the particular manner of associating such oscillators that the originality of the invention should be sought. The previous patent does not mention an oscillator network.

There is a need to create a network of mechanical or electromechanical oscillators coupled together, of which the structure is simple and formed by a reduced number of elements. This would result in an easy production, in particular for the usual deposition and etching techniques in micromechanical or nanomechanical microtechnology, which would yield a product with specific dimensions. It would then be possible to construct a network of oscillators of very small sizes, therefore with a high level of integration on the substrate, to have high frequencies pass through it, o the order of at least the gigahertz, without compromising the transmission of signals in the oscillator network of the invention, and with good characteristics for cutting the transmission around specific oscillation modes, and excessive energy losses. Finally, it would be possible to easily adjust the production parameters and therefore the characteristics of the network, such as the specific frequencies and the coupling characteristics, or to add specific adjusting means, integrated in the network and providing the same possibilities of adjustment once the device has been produced. The oscillators and the coupling means should be formed by a smaller number of elements in order to provide these advantages.

SUMMARY OF THE INVENTION

A general embodiment of the invention involves a mechanical oscillator characterised in that it includes a network of cells joined together, each of the cells being a basic oscillator including a deformable closed-contour beam, and deformable linking beams extending over rows and joined to a plurality of closed-contour beams.

In the sense of the invention, the deformable beams actually change shape during the vibration, by alternately absorbing and restoring the kinetic energy and the deformation energy; and the linking beams, often rectilinear, extend over a long length in the network, along a plurality of cells aligned parallel to said beams. Finally, the linking beams include points of anchorage to the stationary substrate, regularly spaced by a step equal to a multiple of the step of the cells. This arrangement makes it possible to introduce modes of vibration at a very high frequency in the linking beams, which are transmitted along them to other regions in the network, owing to the ease of imposing complex deformations between the pairs of anchoring points by a sufficient number of oscillators, which correspond to modes specific to these very high frequencies.

The basic oscillator often also includes rigid oscillating masses joined rigidly to the closed-contour beam.

The oscillators are advantageously resonators.

In numerous embodiments, the network of cells is two-dimensional; the linking beams can then be joined to a plurality of closed-contour beams distributed by pairs on two opposite sides of the linking beams, which makes it possible to establish a coupling not only in the direction of the linking beams but in the perpendicular direction; the information can then be transmitted in this direction perpendicular to the direction of the linking beams as well as in the direction of the linking beams.

The cells can also be delimited by two linking beams in addition to the two linking beams already mentioned, with these other beams being joined to the previous to form quadrilaterals: substantially uniform couplings can then be established between the two main directions of the network.

An important element of the invention concerns the anchorings of the network to a stationary substrate in order to adjust the coupling characteristics. According to the invention, the points of anchorage to the substrate are essentially present on the linking beams. Unlike in the design necessary with isolated oscillators described in the aforementioned French patent, the anchoring points of this network can be arranged according to a periodic mode, allowing a step equal to a multiple of a length of a cell, which means that most of the points of the cells are not anchored. The resulting coupling, which is weaker, consumes less energy and allows for better data transmission in the network.

The network can be complemented with coupling devices, including deformable closed-contour beams free of oscillating rigid masses, between pairs of adjacent cells. Such an arrangement has the advantage of allowing easy modification of the oscillation characteristics of the network.

Another important means for adjusting the coupling in the network consists of providing it with electrodes for creating electric fields in front of the closed-contour beams, the linking beams, or all, in order to modify the stiffness of the beams and therefore the frequency of the vibrations that they transmit.

BRIEF DESCRIPTION OF THE DRAWINGS

These aspects of the invention as well as others will now be described in view of the following figures:

FIGS. 6, 7 and 8 show a mode of propagation of the oscillations in one cell, then two, then three cells or more (network) according to the general case;

FIGS. 9, 10 and 11 show three oscillation modes in two-dimensional networks;

DETAILED DESCRIPTION OF THE INVENTION

Figure 1:
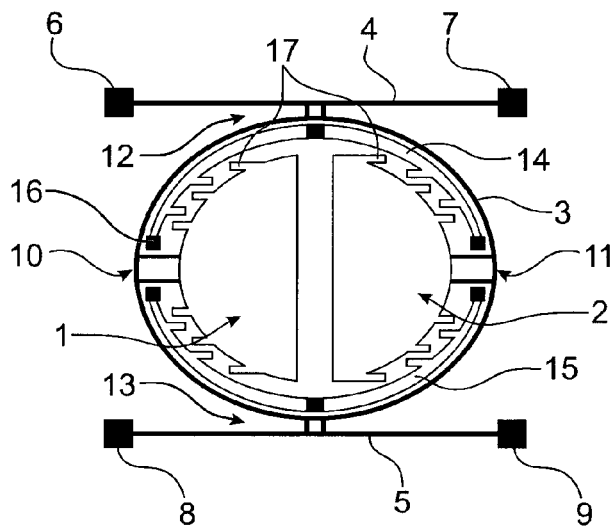
FIG. 1 shows an embodiment of a basic oscillator.

FIG. 1 shows a basic oscillator. It includes two rigid masses 1 and 2 surrounded by a deformable closed-contour beam 3 supported by two parallel deformable anchoring beams 4 and 5, which are advantageously rectilinear (in order to facilitate the assembly of the network) leading a four anchoring points 6, 7, 8 and 9 to an underlying substrate. The deformable closed-contour beam 3 is connected to the masses 1 and 2 and to the anchoring beams 4 and 5 by connecting beams 10, 11, 12 and 13. These connecting beams, which in this case are doubled in pairs of parallel beams, are very rigid and short with respect to the previous ones, so that they can be considered to perfectly transmit the movements or the deformations of the elements that they connect. Finally, the oscillator includes means for causing the oscillation of masses 1 and 2 constituted by stationary combs 14 and 15 housed between the closed-contour beam 3, the masses 1 and 2 and the connecting beams 10 and 11. They are detached from the other elements of the oscillator, but attached to the substrate by anchoring points commonly referenced as 16, of which there may be three for each of the combs 14 and 15. Their teeth overlap or are "interdigitated" according to the vocabulary frequently used in the field, in teeth commonly referenced as 17 of mobile combs established on masses 1 and 2. The oscillator is made of silicon coated with conductive layers, at least on the stationary combs, which serve to generate electrical fields.

In the preferred embodiment, the closed-contour beam 3 is elliptical, the anchoring beams 4 and 5 are parallel to the large axis of the ellipse of the beam 3, the anchoring points 6, 7, 8 and 9 are at the corners of a rectangle and the masses 1 and 2 are in the shape of a half-moon, with their teeth 17 being placed on the domed surfaces, apart from one another, and directed in the direction of the large axis of said ellipse; the teeth of the combs 14 and 15 are directed similarly. This arrangement makes it possible to create electrical forces by controlling the electrical potential of the stationary combs 14 and 15 (for devices that are not shown, but are well known in the prior art) in order to cause the movements of the masses 1 and 2 in the direction of the large axis of the ellipse, which deform the closed-contour beam 3 and the anchoring beams 4 and 5. The closed contour of the beam 3, and in particular its elliptical shape, as well as the orientation of the anchoring beams 4 and 5, promote the appearance of a phase shift in the movement of masses 1 and 2, which constantly move away from and toward one another when they are excited, while the other possible vibration modes appear much less easily, since the network of beams would be, for example, much more rigid for a movement of masses 1 and 2 in phase.

In FIG. 1, the (original) configuration proposed of the stationary combs 14 and 15 restricts the desired movement out of phase with a single electrical signal: there is no need to bring the signal out of phase with two distinct combs; the device includes an electrical connection plot, an electrical wire and a group of stationary combs instead of two wires and two groups of combs as in the prior art.

This basic oscillator will be seen in the networks to be described below, with a simplified representation in which the combs and their teeth are not shown. However, the combs may or may not be present on the oscillators depending on whether they are motors or simply transmitters of oscillators. The oscillators can optionally be different from one another, in particular with regard to their masses and their rigidities. The oscillating masses 1 and 2 can themselves be omitted, in particular when producing networks capable of propagating at very high frequencies.

Certain embodiments of the invention will have the rates shown in FIGS. 2, 3, 4 and 5, in which the basic oscillators have reference 18 and are grouped in two-dimensional networks in which they occupy one cell each. An important aspect to consider is that the anchoring beams 4 and 5 of the basic oscillator of FIG. 1 are now common to a plurality of basic oscillators 18, i.e. they are prolonged continuously from a basic oscillator 18 to its neighbours over distances that may be large. We will now describe linking beams, with reference 19 for beams extending in one direction (here, along the large axes of the ellipses like the anchoring beams 4 and 5 of the basic oscillator of FIG. 1), and reference 20 for beams similar to the previous ones, in particular deformable, but that extend parallel to the small axes of the ellipses. These second linking beams 20, which do not have an equivalent in the device of FIG. 1, are generally joined to the linking beams 19 in the locations of their crossings.

Figure 10:
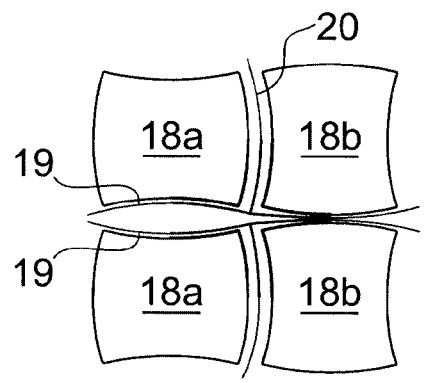
Figure 11:
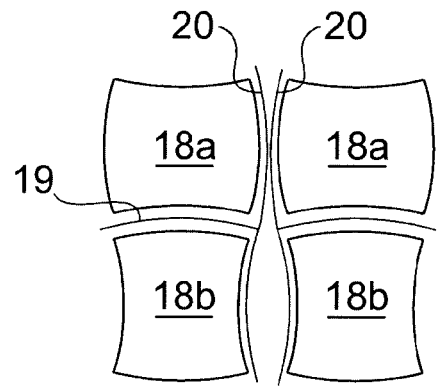
Figure 16:
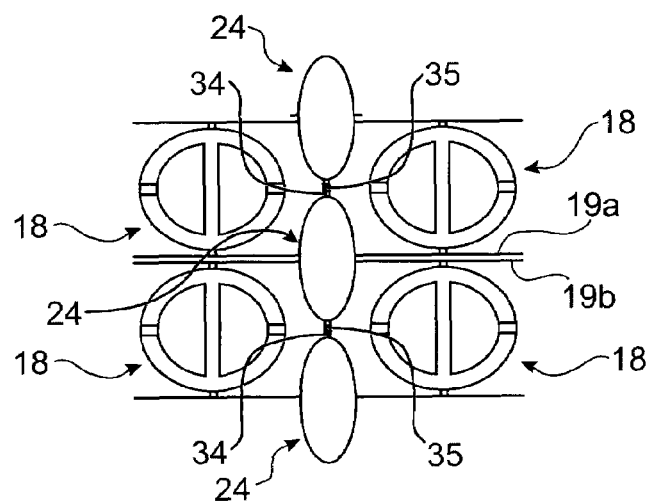

The linking beams 19 and 20 have been shown as common to the basic oscillators 18 on both sides of which they extend, i.e. connected to all of these basic oscillators, but this is not obligatory, and they may be replaced by arrangements with parallel and contiguous linking beams 19 and 20, each connected to the basic oscillators 18 on a respective side, as shown, for example, in FIGS. 10, 11 and 16.

Figure 2:
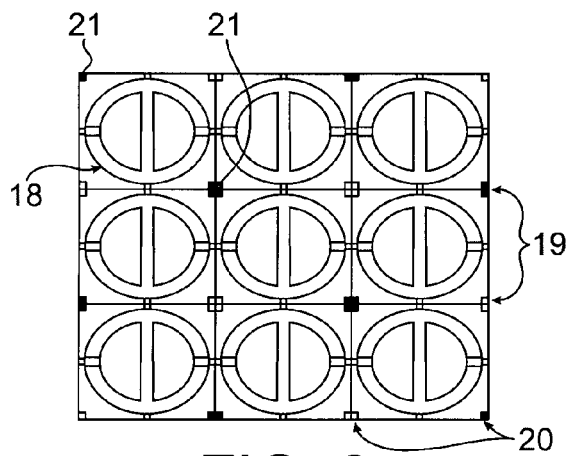
FIGS. 2, 3, 4 and 5 show four embodiments of networks of such oscillators.
Figure 4:
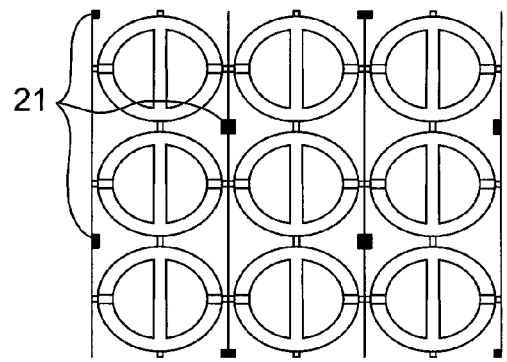
Figure 3:
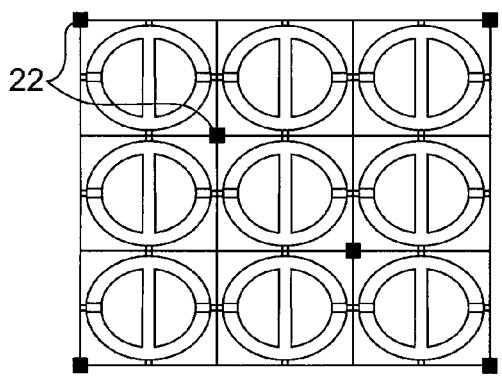
Figure 5:
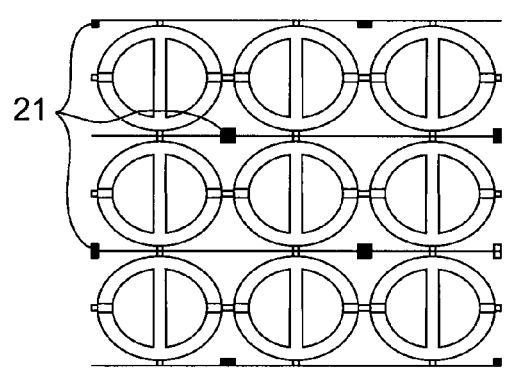

In the embodiment of FIG. 2, the first and second linking beams 19 and 20 cross one over the other, forming continuous and rectangular contours for each of the cells encompassing each of the basic oscillators 18. The same applies to FIG. 3. FIG. 4 shows an arrangement in which only the second linking beams 20 exist, and FIG. 5 shows an arrangement in which only the first linking beams 19 exist.

Another aspect to be considered in these networks is that of anchoring points. The junction of a network of basic oscillators 18 by linking beams 19 and 20 makes it possible to use a smaller number of anchoring points than in each corner of one of the basic oscillators 18: in the embodiment of FIG. 2, the anchoring points 21 are present in two opposite corners of each of the basic oscillators 18, i.e. they are arranged in staggered rows from one linking beam 19 or 20 to the next, being present at a step of two cells on each of the linking beams 19 and 20 and with a phase shift from one linking beam 19 or 20 to the next; in the embodiment of FIG. 3, the anchoring points 22 are present at a step of three cells on each of the linking beams 19 and 20, again with a phase shift causing them to be staggered; other arrangements of anchoring points are possible, with the periodic ones being preferred. The crossings with mutual connections of the linking beams 19 and 20 theoretically make it possible to use a very small number of anchoring points in order to hold the network on the substrate, unless it is to have very little rigidity. In the production of FIG. 4 and that of FIG. 5, patterns of anchoring points 21 similar to that of FIG. 2, and which are denoted by reference 21, were chosen.

With out-of-phase oscillations being promoted for each of the basic oscillators 18, and the elliptical closed-contour beam 3 being deformed in both directions orthogonal to the plane, the deformation of one of them may be propagated to its neighbours and throughout the entire network by the linking beams 19 and 20.

The operation of the networks will depend on a certain number of factors, in addition to the characteristics of the basic oscillators 18:

the presence or the absence of certain linking beams between the adjacent basic oscillators 18;

the possible doubling of the linking beams into parallel and contiguous beams of which one follows the movements of the row of basic oscillators 18 on one side, and the other follows the movements of the row of the basic oscillators 18 on the other side: such doubled and contiguous beams can be deformed independently; when this arrangement is adopted, the opposite oscillators at the top and bottom undergo independent movements, even though these movements are necessarily opposed for basic oscillators 18 joined to a middle and common linking beam 19 or 20;

the number and distribution of anchoring points. Their generally periodic distancing defines patterns in the network, of which the characteristics are identical. In the embodiments of FIGS. 2, 4 and 5, the patterns will have a span of 2×2 cells; in that of FIG. 3, they will have a span of 3×3 cells;

the existence of crossings with connections of linking beams 19 or 20 at the boundaries of cells not provided with an anchoring point;

the stiffness of the linking beams;

the isotropy or anisotropy of the network for the two main directions defined along the linking beams 19 and 20;

the stability of the properties of the oscillators and the linking beams on the surface of the network.

In general, it is possible to modify the stiffness of the deformable beams and the value of the oscillating masses, as well as the boundary conditions of the oscillating beams (they are almost immobile at the anchoring points, and connected together at the intersections with a connection to the perpendicular linking beams so that their angular movements are identical), and thus act on the general or local resonance frequency of the network, depending on whether the adjustments involve the entire network or a portion thereof, and therefore on the speed at which data will travel through the network. Some operations will now be described in reference to the following figures.

FIG. 6 shows the way in which a particular basic oscillator 18 is deformed: the masses 1 and 2 move out of phase, the closed-contour beam 3 is deformed with a modification in the length ratio of the axes of the ellipse, and the linking beams 19 are also deformed out of phase, for example by making the cell concave in their locations; the linking beams 20, when they exist, also have deformations opposite one another that are also opposite those of the linking beams 19, so that the cell becomes convex at their locations. The rate of the deformations and the resonance frequency are dependent, inter alia, on the boundary conditions, and in particular the presence and the number of anchoring points at the corners of the basic oscillator 18, or crossings with connections of linking beams.

FIG. 7 shows a pair of adjacent oscillators 18 connected together by a common linking beam 20a, i.e., which is connected to one of the masses of each of the oscillators 18a and 18b. If there is no anchoring point at the crossings between the linking beams 19 and the common linking beams 20a, at points P and Q, the linking beams 19 can be deformed over a larger span, according to a complex mode in this case including two vibration loops along the pair of basic oscillators 18 considered, between the boundary points A and B of the quadrilateral A B C D that it forms. The frequency of the mode and its shape will also be dependent on multiple parameters of stiffness, dimensions, masses and boundary conditions as already indicated.

This can be generalised to a larger number of oscillators, for example to the three basic oscillators 18a, 18b and 18c of FIG. 8: two common linking beams 20a and 20b connect them; the linking beams 19 are deformed according to a mode extending over the span of the three cells considered, and which is also dependent on the same parameters, including the boundary conditions at the corners A, B, C and D of this cell pattern.

In practice, in silicon micromachining techniques, resonance frequencies on the order of the kilohertz or the megahertz are sought with patterns of at least two or three cells, or even ten cells per side. In nanomachining techniques, it will be possible to use patterns of a higher order and resonance frequencies higher than the gigahertz, and which can be further increased by reducing the oscillating masses 1 and 2 or even by eliminating them completely for at least some of the cells of the network. The more the invention is carried out on a small scale with a large number of cells, the more the network can have a large number of cells and therefore have greater variations in propagation time.

With regard to the network of FIG. 2, it is emphasised that it shows one of the preferred embodiments first due to the regularity of its structure, which gives it a relatively high isotropy, and then due to the fact that the basic oscillators are distributed in two groups, as shown in FIG. 9. By following the rows as well as the columns of the network, it is found that the basic oscillators 18 alternately take two opposite deformation phases for the span of the pattern, noted 18d and 18e, respectively, due to the presence of the staggered anchoring points 21 and the common nature of the linking beams 19 and 20. The simultaneous transmission of one phase of a signal as well as its opposite is therefore perfectly determined and imposed along the network. This particular characteristic is sought in numerous electronics applications. It is also advantageous from a mechanical perspective since the centre of gravity of a network remains immobile, which makes it more stable, and the energy dissipation is minimised in a steady state.

FIGS. 10 and 11 show other possibilities, obtained when only linking beams 20 or linking beams 19 are common and the others are doubled: the alternation of opposite phases between adjacent cells is achieved only along rows in the arrangement of FIG. 10, and along columns in the arrangement of FIG. 11; but from one row to another or from one column to another, the distribution of phases can be any between adjacent basic oscillators 18 in the absence of a connection, and it is possible that they are at the same phase, which is shown in these figures. The rows or columns are then independent transmitters.

Figure 12:
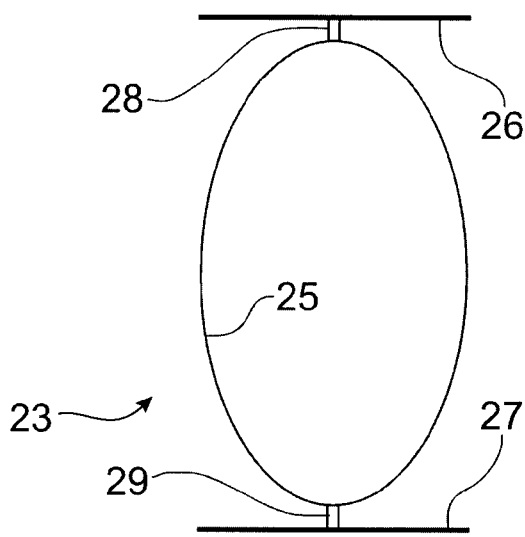
FIGS. 12 and 13 show two embodiments of massless couplers.
Figure 13:
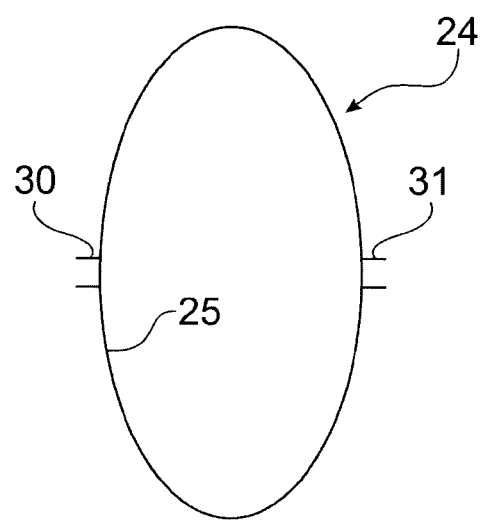

Other features of the invention will now be described. First, couplers, shown in FIGS. 12 and 13 for their main embodiments, can be added to certain places in the network between some of the cells already described. These two embodiments have in common a closed-contour beam 25, preferably elliptical like beam 3; it is equipped with linking beams 26 and 27 at the adjacent portions of the network, which are parallel in FIG. 12, and which are joined to the ends of the closed-contour beam 25 according to the large axis of the ellipse by connecting beams 28 and 29, or by a pair of connecting beams 30 and 31 at the ends of the small axis of the ellipse and directed in the direction of this axis in FIG. 13.

Figure 14:
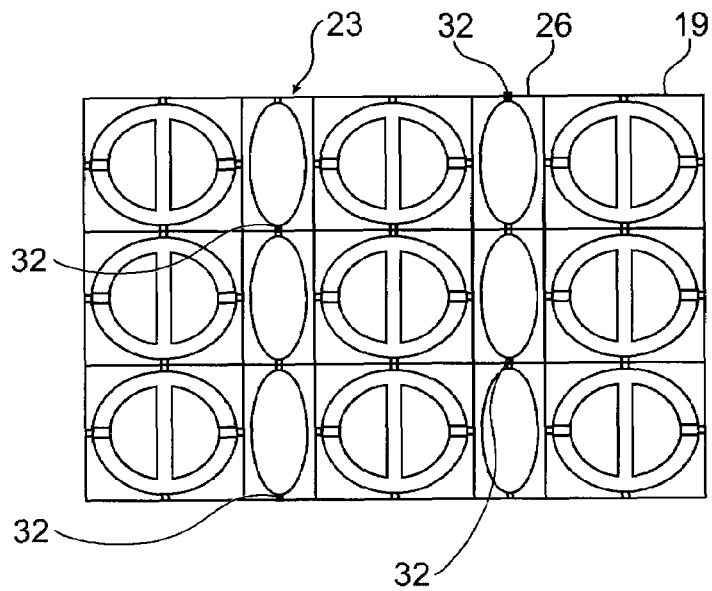
FIGS. 14, 15, 16 and 17 show four embodiments of networks provided with such couplers.

These couplers 23 and 24 can be implanted on the network in various ways, as shown by the examples in the following figures. In FIG. 14, couplers 23 aligned in columns separate basic oscillators 18 in each of the rows, with their linking beams 26 being incorporated with linking beams 19. Additional anchoring points 32 can be added to increase the stiffness of the network, as at the intersections of the connecting beams 28 and 29 with the linking beams 19, also according to a staggered pattern, with a crossing over two along each of the columns and with a shift of columns from one linking beam 19 to the next. In the embodiment shown, the linking beams 19, common to two rows of basic oscillators 18, are in an extension of the linking beams 26 and 27 of the couplers 23 and merged with them.

Figure 15:
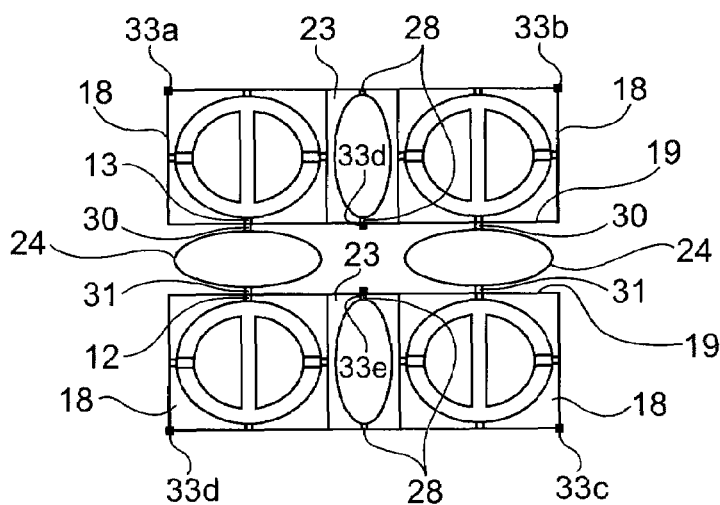

A similar arrangement is used for the network of FIG. 15, but the rows are this time separated by couplers 24 of the second type, placed in the reverse manner with respect to the couplers 23 of FIG. 14 (shown here), i.e. with perpendicular ellipse axes. Such an arrangement makes it possible to connect connecting beams 30 and 31 to linking beams 19 in front of the beams 12 and 13 of the basic oscillators 18. In this case, the linking beams 20 are interrupted in the location of the couplers 24. The anchoring points 33 are distributed in a somewhat more complex manner, at the corners of each pattern including four basic oscillators 18 (33a, 33b, 33c and 33d) and four couplers 23 and 24 and, near the centre of the pattern, at the connections between beams 28 and 29, connecting beams of the couplers 23 and linking beams 19 (33d and 33e).

A different arrangement is shown in FIG. 16. It includes exclusively couplers 24 of the second type, arranged in columns separating columns of basic oscillators 18 as in FIG. 14, but the couplers 24 are staggered with respect to the basic oscillators 18, i.e. their small ellipse axes are aligned with the linking beams 19, with which their connecting beams 30 and 31 merge. In the frequent case in which these connecting beams 30 and 31 include two parallel elements, it is indicated to use linking beams 19a and 19b doubled and respectively associated with the upper row and the lower row of basic oscillators 18. The couplers 24 are in this case equipped with connecting beams 34 that are short and rigid, which join them at their large ellipse axis ends. The anchoring points 35 are placed at these connecting beams 34.

Figure 17:
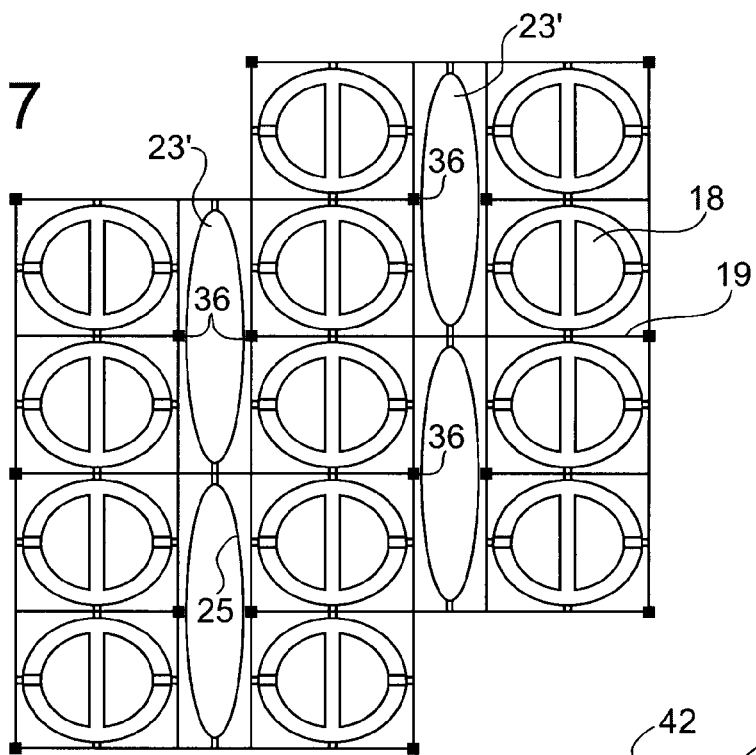

The network of FIG. 17 is distinguished from the previous by two characteristics: the couplers, in this case referenced by 23', have a length double that of the oscillators 18, i.e. they extend between two pairs of each of them, and they also extend in a staggered fashion from one column to the other, i.e. their corners and their small ellipse axes alternate along the linking beams 19, which are interrupted as they reach the front of the small ellipse axes 25. The anchoring points of the network have the reference 36 and are placed at these interruptions of the linking beams 19; in this case, they are also placed at the crossings with the linking beams 20.

Other types of couplers may also be proposed, but it is not always necessary to use them, in the networks of oscillators of this invention. The function of couplers is to adjust the local and general properties of the network independently of the oscillators, since their oscillation characteristics are very different from those of the oscillators, with the couplers being almost massless and their stiffness capable of being very different from that of the oscillators.

A final important characteristic of the invention that will now be described also makes it possible to adjust, over time, the couplings between the elements of the network as well as the propagation of data therein (dynamic coupling).

Figure 18:
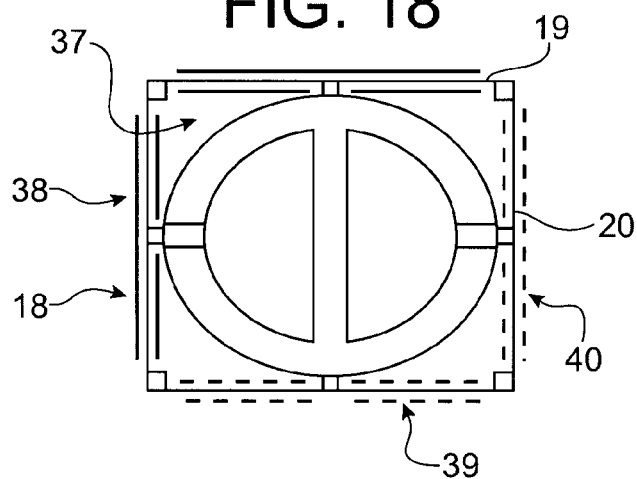
FIGS. 18, 19 and 20 show three arrangements of electrodes for adjusting the stiffness of the beams.

FIG. 18 shows a basic oscillator 18 of which the linking beams 19 and 20 are equipped with electrodes that subject them to an electrical field. These electrodes are adjacent to linking beams 19 and 20 and extend at least on one side of the linking beam or on both sides of them. The electrical field can be direct or alternating current. The electrical forces acting on the linking beams 19 and 20 make it possible to modify their stiffness at the oscillation and therefore the ease of reacting to the movements communicated to the masses 1 and 2 or to the adjacent basic oscillators 18; a weak or strong coupling of one oscillator to another can thus be controlled, and the coupling can even be completely prevented by imposing a high stiffness that makes the basic oscillator 18 considered immobile: the transmission of data would then be interrupted.

The embodiment represented shows continuous electrodes 37 and 38 for a linking beam 19 and a linking beam 20, and discontinuous electrodes 39 and 40 for the other of the linking beams 19 and the other of the linking beams 20. The discontinuous electrodes can be controlled segment-by-segment and therefore provide greater freedom of adjustment. Any distribution of continuous and discontinuous electrodes is possible.

Figure 19:
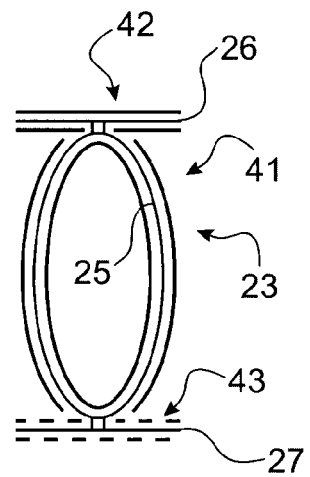

The embodiment of FIG. 19 involves the coupler 23 of the first type. Electrodes 41 extend around the elliptical beam 25 (more specifically around it for one of the electrodes of the pair, and in it for the other of the electrodes of the pair), and electrodes 42 and 43 in front of the linking beams 26 and 27. Here again, the choice of continuous or discontinuous electrodes is arbitrary; continuous electrodes 41 and 42 and discontinuous electrodes 43 are shown.

Figure 20:
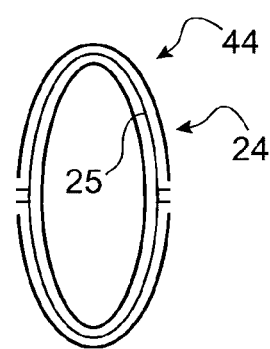

Finally, FIG. 20 shows a pair of electrodes 44 around the elliptical beam 25 of a coupler of the second type 24.

The continuous electrodes are of course interrupted in the places where they would collide with other elements of the network, such as the connecting beams.

Electrodes may also be placed near closed-contour beams 3 of the basic oscillators 18 provided with oscillating masses 1 and 2.

The invention claimed is:

1. A mechanical oscillator comprising:
at least two deformable linking beams connected to a stationary substrate at a plurality of anchoring points which are distributed along the deformable linking beams, the deformable linking beams facing each other; and
a plurality of vibrating cells each connected to and disposed between said at least two deformable linking beams, said plurality of vibrating cells being distributed along the deformable linking beams and a length between two of the plurality of anchoring points being greater or equal to a length of a number of cells greater or equal to 1, wherein
each of the plurality of vibrating cells includes a deformable beam having a closed contour, said deformable beam being connected to said at least two deformable linking beams at a first pair of parts which are opposite to each other in the deformable beam.

2. The mechanical oscillator according to claim 1, wherein the deformable linking beams are connected to pairs of the plurality of vibrating cells, the plurality of vibrating cells in each of the pairs being present at opposite sides of the linking beams and forming a two-dimensional network.

3. The mechanical oscillator according to claim 1, wherein the plurality of vibrating cells are delimited by two of said deformable linking beams joined together with two other linking beams to form quadrilaterals.

4. The mechanical oscillator according to claim 1, wherein the anchoring points include periodic identical patterns for the deformable linking beams, said patterns being offset from one to another along the deformable linking beams.

5. The mechanical oscillator according to claim 1, further comprising:
coupling devices extending between pairs of the plurality of vibrating cells, wherein the coupling devices include rigid oscillating deformable closed-contour beams, each of the plurality of vibrating cells including two oscillating masses joined rigidly to the deformable beam having the closed contour.

6. The mechanical oscillator according to claim 5, wherein the coupling devices extend along a plurality of said pairs of the plurality of vibrating cells.

7. The mechanical oscillator according to claim 6, wherein the coupling devices extend in a staggered fashion, in parallel rows in which the coupling devices are offset from one to another of said parallel rows.

8. The mechanical oscillator according to claim 1, further comprising:
electrodes, facing the deformable beams having the closed contour, that create an electrical field to adjust stiffness of the deformable beams having the closed contour.

9. The mechanical oscillator according to claim 1, further comprising:
electrodes, facing the deformable linking beams, that create an electrical field to adjust stiffness in front of the deformable linking beams.

10. A mechanical oscillator comprising:
at least two deformable linking beams connected to a stationary substrate at a plurality of anchoring points which are regularly distributed along the deformable linking beams, and at spans in all of the deformable linking beams, the deformable linking beams being parallel to each other;
a plurality of vibrating cells each connected to and disposed between said at least two deformable linking beams, said plurality of vibrating cells being regularly distributed along the deformable linking beams with a pitch, a ratio between said spans and said pitch being an integer greater than or equal to 1, wherein
the plurality of vibrating cells include a deformable beam having a closed contour, said deformable beam being connected to each of the deformable linking beams at a first pair of parts which are opposite to each other in the deformable beam having the closed contour, and
the plurality of vibrating cells being interconnected between the deformable linking beams.

11. The mechanical oscillator according to claim 10, wherein the plurality of vibrating cells form a two-dimensional network and are connected to at least one of the linking beams at both sides thereof.

12. The mechanical oscillator according to claim 10, wherein said deformable linking beams include a first set of linking beams and at least two other parallel deformable linking beams that include a second set of linking beams, the linking beams of the first set crossing the linking beams of the second set, the plurality of vibrating cells being enclosed inside quadrilateral areas defined by a pair of linking beams of the first set and a pair of linking beams of the second set.

13. The mechanical oscillator according to claim 10, wherein the anchoring points include identical patterns for the deformable linking beams, said patterns being staggered with respect to one another along the deformable linking beams.

14. The mechanical oscillator according to claim 10, further comprising:
coupling devices extending between pairs of the plurality of vibrating cells, wherein the coupling devices include rigid oscillating deformable closed contour beams, each of the plurality of vibrating cells including two oscillating masses joined rigidly to the deformable beam having the closed contour.

15. The mechanical oscillator according to claim 14, wherein the coupling devices extend along a plurality of said pairs of the plurality of the vibrating pairs of cells.

16. The mechanical oscillator according to claim 15, wherein the coupling devices extend in a staggered fashion, in parallel rows in which the coupling devices are offset from one to another of said parallel rows.

17. The mechanical oscillator according to claim 10, further comprising:
electrodes, facing the deformable beam having the closed contour, that create an electrical field to adjust stiffness of the deformable beams having the closed contour.

18. The mechanical oscillator according to claim 10, further comprising:
electrodes, facing the deformable linking beams, that create an electrical field to adjust stiffness in front of the deformable linking beams.

19. A mechanical oscillator comprising:
at least two deformable linking beams connected to a stationary substrate at a plurality of anchoring points which are regularly distributed along the deformable linking beams, and at equal spans in all of the deformable linking beams, the linking beams being parallel to each other; and
a plurality of vibrating cells each connected to and disposed between said at least two deformable linking beams, said plurality of vibrating cells being regularly distributed along the deformable linking beams with a constant pitch, a ratio between said spans and said pitch being an integer greater than 1, wherein
the plurality of vibrating cells includes a deformable beam having a closed contour, said deformable beam being connected to each of the deformable linking beams at a first pair of parts which are opposite to each other in the deformable beam, a pair of masses rigidly connected to the deformable beam at a second pair of parts which are opposite to each other, and
the plurality of vibrating cells being connected to adjacent cells along the deformable linking beams at a third pair of parts which are opposite to each other and each extend at a middle distance between said first pair of parts.

20. The mechanical oscillator according to claim 19, wherein the plurality of cells form a two-dimensional network and are connected to at least one of the linking beams at both sides thereof.

21. The mechanical oscillator according to claim 19, wherein said deformable linking beams include a first set of linking beams and at least two other parallel deformable linking beams that include a second set of linking beams, the linking beams of the first set crossing the linking beams of the second set, the plurality of cells being enclosed inside quadrilateral areas defined by a pair of linking beams of the first set and a pair of linking beams of the second set.

22. The mechanical oscillator according to claim 19, wherein the anchoring points include identical patterns for the deformable linking beams, said patterns being staggered with respect to one another along the deformable linking beams.

23. The mechanical oscillator according to claim 19, further comprising:
coupling devices extending between pairs of the plurality of vibrating cells, wherein the coupling devices include rigid oscillating deformable closed-contour beams, each of the plurality of vibrating cells including two oscillating masses joined rigidly to the deformable beam having the closed contour.

24. The mechanical oscillator according to claim 23, wherein the coupling devices extend along a plurality of said pairs of the plurality of the vibrating cells.

25. The mechanical oscillator according to claim 24, wherein the coupling devices extend in a staggered fashion, in parallel rows in which the coupling devices are offset from one to another of said parallel rows.

26. The mechanical oscillator according to claim 19, further comprising:
electrodes, facing the deformable beam having the closed contour, that create an electrical field to adjust stiffness of the deformable beams having the closed contour.

27. The mechanical oscillator according to claim 19, further comprising:
electrodes, facing the deformable linking beams, that create an electrical field to adjust stiffness in front of the deformable linking beams.

* * * * *